(12) United States Patent
Wang (10) Patent No.: US 10,388,679 B2
(45) Date of Patent: Aug. 20, 2019

(54) ARRAY SUBSTRATE HAVING SOURCE AND DRAIN TRANSFER PORTIONS INTEGRATED WITH CHANNEL AND LIQUID CRYSTAL DISPLAY PANEL INCLUDING SAME

(71) Applicant: Shenzhen China Star Optoelectronics Technology Co., Ltd., Shenzhen, Guangdong (CN)

(72) Inventor: Zhiwu Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 16/245,276

(22) Filed: Jan. 11, 2019

(65) Prior Publication Data

US 2019/0148418 A1    May 16, 2019

Related U.S. Application Data

(62) Division of application No. 15/125,176, filed on Sep. 11, 2016, now Pat. No. 10,204,941.

(51) Int. Cl.
*H01L 27/12* (2006.01)
*G02F 1/1333* (2006.01)
(Continued)

(52) U.S. Cl.
CPC .... *H01L 27/1274* (2013.01); *G02F 1/133345* (2013.01); *G02F 1/136209* (2013.01);
(Continued)

(58) Field of Classification Search
CPC .............. H01L 27/127; H01L 27/1274; G02F 1/136209
See application file for complete search history.

(56) References Cited

U.S. PATENT DOCUMENTS 9,142,573 B1 * 9/2015 Yamashita ........ G02F 1/136213
2008/0012476 A1    1/2008 Kim
(Continued)

FOREIGN PATENT DOCUMENTS

CN    101097873 A    1/2008
CN    102064109 A    5/2011
(Continued)

OTHER PUBLICATIONS

Ohinese Patent Application 2016102840667—First Office Action.
International Application PCTCN2016085996 PCT_International Search Report.

*Primary Examiner* — Quoc D Hoang
(74) *Attorney, Agent, or Firm* — Andrew C. Cheng (57) ABSTRACT

An array substrate includes a substrate, a gate electrode, a gate insulating layer and an active layer formed in sequence in a stack. The active layer includes a source transfer portion and a drain transfer portion separated from the source transfer portion and a channel integrally connected to the source transfer portion and the drain transfer portion. Contact resistances between the source transfer portion, the drain transfer portion and the channel are reduced, and interface defects of the channel are reduced, so that through the source transfer portion and the drain transfer portion, an on-state current of a thin film transistor is increased and an off-state current is reduced so that is the on/off ratio is raised to improve the performance of the array substrate.

10 Claims, 6 Drawing Sheets

(51) Int. Cl.
*H01L 29/786* (2006.01)
*H01L 29/66* (2006.01)
*G02F 1/1362* (2006.01)
*G02F 1/1368* (2006.01)

(52) U.S. Cl.
CPC ...... *H01L 27/1218* (2013.01); *H01L 27/1225* (2013.01); *H01L 29/66969* (2013.01); *H01L 29/7869* (2013.01); *H01L 29/78618* (2013.01); *H01L 29/78693* (2013.01); *G02F 1/1368* (2013.01); *G02F 2202/10* (2013.01)

(56) References Cited

U.S. PATENT DOCUMENTS

2011/0031491 A1* 2/2011 Yamazaki ......... G02F 1/136227
 257/43
2014/0027729 A1* 1/2014 So ...................... H01L 51/5056
 257/40

FOREIGN PATENT DOCUMENTS

| CN | 103219283 A | 7/2013 |
| CN | 104637950 A | 5/2015 |

\* cited by examiner

ARRAY SUBSTRATE HAVING SOURCE AND DRAIN TRANSFER PORTIONS INTEGRATED WITH CHANNEL AND LIQUID CRYSTAL DISPLAY PANEL INCLUDING SAME

CROSS REFERENCE TO RELATED APPLICATIONS

This is a divisional application of co-pending U.S. patent application Ser. No. 15/125,176, filed on Sep. 11, 2016, which is a national stage of PCT Application No. PCT/CN2016/085996, filed on Jun. 16, 2016, claiming foreign priority of Chinese Patent Application No. 201610284066.7, entitled "Array Substrate, Liquid Crystal Display Panel and Method of Manufacturing the Array Substrate", filed on Apr. 29, 2016, the disclosure of which is incorporated herein by reference in its entirety.

FIELD OF THE INVENTION

The present invention relates to a display technology field, and more particularly to an array substrate, liquid crystal display panel and method of manufacturing the array substrate.

BACKGROUND OF THE INVENTION

The steps of the formation of a source electrode, a drain electrode and a channel is separate in the current liquid crystal display panel, at first, a metal oxide layer is pre-formed annealing at a certain temperature to form the channel, and the source electrode and the drain electrode are connected to the metal oxide layer, such that the source electrode and the drain electrode is conducting after contact with the metal oxide. However, in this approach, since the source electrode, the drain electrode and the metal oxide is connected by the way of contacting, causing the contact resistance between the source and drain electrodes and the metal oxide layer is larger, making poor contact characteristics, and causing the on-state current (Ion) through the source and the drain electrodes of the thin film transistor of the liquid crystal display panel is less. At the same time, the source electrode, the drain electrode and the metal oxide is connected to the metal oxide layer by the way of contacting makes more defects occurred in the interface of the metal oxide layer, resulting off-state current (Ioff) through the source and the drain electrodes of the thin film transistor of the liquid crystal display panel is larger, making the turn on and turn off ratio (Ion/Ioff) of the thin film transistor is less, and having serious impact on the performance of the thin film transistor of the liquid crystal display panel, thereby affecting the performance of the liquid crystal display panel.

SUMMARY OF THE INVENTION

The present invention provides an array substrate with high on/off ratio, a liquid crystal display panel and method of manufacturing the array substrate.

An array substrate provided in the present invention, wherein the array substrate includes a substrate, a gate electrode, a gate insulating layer and an active layer formed in stack subsequently; the active layer including a source transfer portion and a drain transfer portion isolated from the source transfer portion, and a channel integrally connected to the source transfer portion and the drain transfer portion; wherein the source transfer portion and the drain transfer portion are formed at a first predetermined temperature; the channel is formed at a second predetermined temperature; and the first predetermined temperature is higher than the second predetermined temperature.

The array substrate further includes a barrier layer, the barrier layer including a first through hole and a second through hole isolated from the first through hotel, and a light shielding area formed between the first through hole and the second through hole; the first through hole and the second through hole expose the source transfer portion and the drain transfer portion respectively; and the light shielding area is covering the channel.

The array substrate further includes a source electrode and a drain electrode disposed on the barrier layer, the source electrode is connected to the source transfer portion through the first through hole, and the drain electrode is connected to the drain transfer portion through the second through hole.

The array substrate includes a plastic layer and a buffer layer stacked on the plastic layer, wherein the gate electrode is stacked on the buffer layer and opposite to the plastic layer.

The active layer is made of the oxide semiconductor, and the source transfer portion and the drain transfer portion located at both ends of the active layer are formed by laser crystallization process.

The present invention further provides a liquid crystal display panel, wherein the liquid crystal display panel includes any one of the array substrate described above.

A method of manufacturing an array substrate is also provided in the present invention, comprising the following steps:

forming a gate electrode, a gate insulating layer and a metal oxide layer on the substrate subsequently; the metal oxide layer including a first region and a second region isolated from the first region, and a third region connected to the first region and the second region; and processing the metal oxide layer, the first region and the second region are formed into the source transfer portion and the drain transfer portion at a first predetermined temperature respectively, the third region is formed the channel at a second predetermined temperature.

The method further comprises:

forming a barrier layer on the metal oxide layer, the barrier layer including a first through hole and a second through hole isolated from the first through hole, and a light shielding area formed between the first through hole and the second through hole; the first through hole and the second through hole expose the first region and the second region respectively; and the light shielding area is covering the third region; and wherein in the step of "processing the metal oxide layer," the barrier layer and the opposite side of the metal oxide layer are subject to an annealing process.

The annealing process is realized by a laser crystallization process.

The step of forming a barrier layer on the metal oxide layer comprises:

forming a complete barrier layer to be processed on the metal oxide layer; and etching the regions of the barrier layer to be processed corresponding to the first region and the second region respectively to form the first through hole and the second through the hole.

The present invention provides an array substrate, a liquid crystal display panel, and a method for manufacturing an array substrate, wherein with an arrangement that an active layer includes a source transfer portion and a drain transfer portion isolated from the source transfer portion and a channel integrally connected to the source transfer portion and the drain transfer portion, the source transfer portion, the drain transfer portion and the channel are made as an integral structure, i.e., contact resistances between the source transfer portion, the drain transfer portion and the channel are reduced and interface defects of the channel are reduced, so that through the source and drain electrodes, an on-state current of a thin film transistor of a liquid crystal display panel is increased and an off-state current is reduced through, and thus the on/off ratio is raised, to thereby improve the performance of the array substrate. In addition, in a laser irradiation process that is applied to form the source transfer portion and the drain transfer portion, the defects in the channel are significantly reduced by the annealing process, to improve the performance of thin film transistors.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained should be considered within the scope of protection of the present invention.

Specifically, the terminologies in the embodiments of the present invention are merely for describing the purpose of the certain embodiment, but not to limit the invention. Examples and the claims implemented in the present invention require the use of the singular form of the book "an", "the" and "said" are intend to include most forms unless the context clearly dictates otherwise. It should also be understood that the terminology used herein that "and/or" means and includes any or all possible combinations of one or more of the associated listed items.

Figure 1:
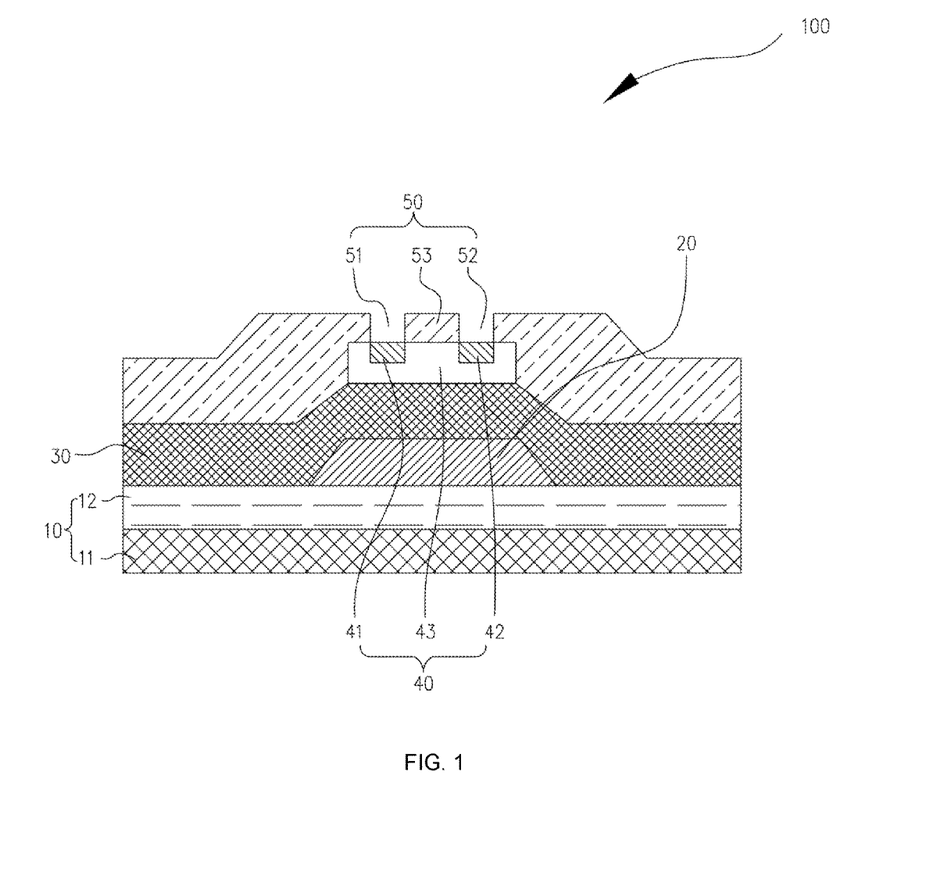
FIG. 1 illustrates a schematic structure of an array substrate of the present invention.
Figure 3:
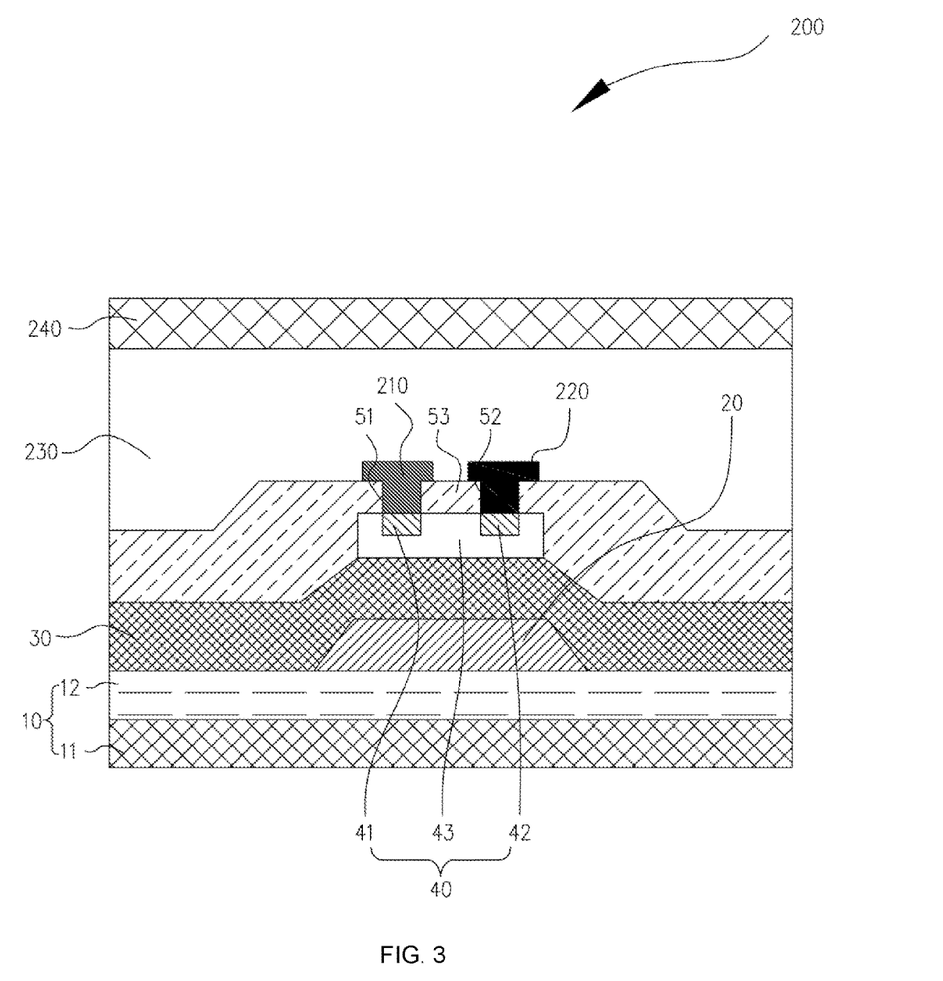
FIG. 3 illustrates a schematic structure of a liquid crystal display panel of the present invention.

Referring to FIGS. 1 and 3, an array substrate 100 is provided in the present invention. The array substrate 100 includes a substrate 10, a gate electrode 20, a gate insulating layer 30 and an active layer 40 formed subsequently in a stack. The active layer includes a source transfer portion 41 and a drain transfer portion 42 isolated from the source transfer portion 41, and a channel 43 integrally connected to the source transfer portion 41 and the drain transfer portion 42. It can be understood that the array substrate 100 is applied to the liquid crystal display panel 200, and the source transfer portion 41 and the drain transfer portion 42 of the array substrate 100 can be electrically connected to a source electrode 210 and a source electrode 220 respectively. The conductive properties of the source transfer portion 41 and the drain transfer portion 42 are superior to the channel 43 to reduce the impedance so as to provide a better conductive property to the thin film transistor of the liquid crystal display panel 200. The liquid crystal display panel 200 can be a flexible organic light-emitting diode (OLED) or a liquid crystal display module (LCD module or LCM).

The active layer 40 includes the source transfer portion 41 and the drain transfer portion 42 isolated from the source transfer portion 41 and the channel 43 integrally connected to the source transfer portion 41 and the drain transfer portion 42 so that the source transfer portion 41, the drain transfer portion 42 and the channel 43 become an integral structure, i.e., contact resistances between the source transfer portion 41, the drain transfer portion 42 and the channel 43 are reduced and interface defects of the channel 43 are reduced, so that an on-state current is increased, and an off-state current is reduced through the source transfer portion 41 and the drain transfer portion 42 of the thin film transistor of the liquid crystal display panel 200, namely the on/off ratio is raised to improve the performance of the array substrate 100.

In this embodiment, the substrate 10 is a flexible substrate. The substrate 10 includes a plastic layer 11 and a buffer layer 12 stacked on the plastic layer 11. The gate electrode 20 is stacked on the buffer layer 12 and opposite to the plastic layer 11. Specifically, the plastic layer 11 can be bent randomly, and a material of the plastic layer can be polyethylene naphthalate, polyethylene terephthalate, polyethylene terephthalate or polyimide resin and other materials. A thickness of the plastic layer 11 can be 10 micrometers to 50 micrometers. The buffer layer 12 is formed, through a vacuum evaporation process, on the plastic layer 11. The buffer layer 12 helps fix the gate electrode 20 to the plastic layer 11, so that the gate electrode 20 and the substrate 10 are stably connected and formation of the gate electrode 20 is made easy. In other embodiments, the substrate 10 can also be a rigid plate.

The array substrate 100 further includes a source electrode 210 (the gray portion illustrated in FIG. 3) and a drain electrode 220 (the black portion illustrated in FIG. 3) arranged on a barrier layer 50. The source electrode 210 is connected to the source transfer portion 41 through a first through hole 51, and the drain electrode 220 is connected to the drain transfer portion 42 through a second through hole 52.

In this embodiment, the gate electrode 20 is arranged on the buffer layer 12 in accordance with a predetermined pattern, and can be formed with a vapor deposition process. The gate electrode 20 is made of a metal filament structure, which plays a role of voltage control. The gate insulating layer 30 provides an insulation environment to the gate electrode 20 and the active layer 40. The active layer 40 is made of an oxide semiconductor. The source transfer portion 41 and the drain transfer portion 42 are located at two ends of the active layer 40 and are formed with a laser crystallization process. The characteristic of the source transfer portion 41 and the drain transfer portion 42 of the active layer 40 is similar to the source electrode 210 and drain electrode 220 of the liquid crystal display panel 200, so that the contact resistance between the source transfer portion 41 and the source electrode 210 is reduced and the contact resistance between the drain transfer portion 42 and the drain electrode 220 is reduced, thereby improving the conductive properties of the array substrate 100, namely, the source transfer portion 41 helps transmit an electrical signal from the gate electrode 20 to the source electrode 210 through the channel 43 and the drain transfer portion 42 helps transmit an electrical signal from the gate electrode 20 to the drain electrode 220 through the channel 43. Thus, the contact resistances between the source transfer portion 41, the drain transfer portion 42 and the channel 43 are reduced, and the on-state current and the off-state current of the thin film transistor of the liquid crystal display panel 200 are increased.

In this embodiment, the source transfer portion 41, the drain transfer portion 42 and the channel 43 are integrally provided. Specifically, the source transfer portion 41, the drain transfer portion 42 and the channel 43, before being formed, are disposed above the metal oxide layer jointly, wherein the metal oxide can be indium gallium zinc oxide. By applying a laser annealing process, which is also known as laser crystallization to the metal oxide layer, the two ends of the metal oxide are annealed at a first predetermined temperature and lose oxygen to form the source transfer portion 41 and the drain transfer portion 42. Another portion of the metal oxide is formed, at a second predetermined temperature, as the channel 43.

More specifically, the laser light is arranged to irradiate from the top of the barrier layer 50 to the metal oxide layer, and the regions of the metal oxide layer that are to form the source transfer portion 41 and the drain transfer portion 42 are directly irradiated by the laser light, while the region of the metal oxide layer that is to form the channel 43 is blocked by the barrier layer 50. Blocking the laser light with the barrier layer 50 forms a temperature difference between the first predetermined temperature and the second predetermined temperature, so that the source transfer portion 41, the drain transfer portion 42 and the channel 43 can be formed simultaneously with one process of the laser irradiation. In other embodiments, it is possible to first apply laser irradiation having a first predetermined temperature to one portion of the metal oxide layer to form the source transfer portion 41 and the drain transfer portion 42, and then applying laser irradiation having a second predetermined temperature to another portion of the metal oxide layer to form the channel 43.

Further, the array substrate 100 further includes the barrier layer 50. The barrier layer 50 is provided with a first through hole 51 and a second through hole 52 isolated from the first through hole 51, and a light shielding area 53 formed between the first through hole 51 and the second through hole 52. The first through hole 51 and the second through hole 52 expose the source transfer portion 41 and the drain transfer portion 42 respectively, and the light shielding area 53 covers the channel 43.

In this embodiment, the barrier layer 50 covers the entire active layer 40, and the first through hole 51 and the second through hole 52 are formed with an etching process, such that the first through hole 51 and the second through hole 52 correspond to the source transfer portion 41 and the drain transfer portion 42 respectively. Thus, during the process of forming the source transfer portion 41 and the drain transfer portion 42, the first through hole 51 and the second through hole 52 expose the regions of the metal oxide layer that are to form the source transfer portion 41 and the drain transfer portion 42 respectively and allow the laser light to directly irradiate the exposed regions of the metal oxide layer, so that the exposed regions of the metal oxide layer are treated at the first predetermined temperature that is a higher temperature to form the source transfer portion 41 and the drain transfer portion 42. Another portion of the metal oxide layer is shielded by the light shielding area 53 so as to prevent the laser light from directly irradiating the region that is to form the channel 43 in the metal oxide layer, meaning a part of the heat of the laser light is blocked to prevent an excessive amount of heat applied to the region so that the region of the metal oxide undergoes annealing at the second predetermined temperature to form the channel 43.

In other embodiments, the barrier layer 50 can be formed with a vapor deposition process, whereby the first through hole 51 and the second through hole 52 can be formed with the deposition of the barrier layer 50.

Further, in this embodiment, the metal oxide layer can be irradiated with a high energy generated by a momentary laser pulse, so that the metal oxide layer gains a high temperature and a crystal structure thereof is changed correspondingly. With the arrangement of the first through hole 51 and the second through hole 52 in the barrier layer 50, the source transfer portion 41, the drain transfer portion 42 and the channel 43 can be formed in the metal oxide layer simultaneously through one process of laser crystallization. Further, in the process of laser crystallization, defects within the metal oxide can be significantly reduced through high temperature annealing, and the performance of the thin film transistor so formed can be bettered.

When the source transfer portion 41 is electrically connected to the source electrode 210 of the liquid crystal display panel 200, the source electrode 210 extends through the first through hole 51; and when the drain transfer portion 42 is electrically connected to the drain electrode 220 of the liquid crystal display panel 200, the drain electrode 220 extends through the second through hole 52.

Figure 2:
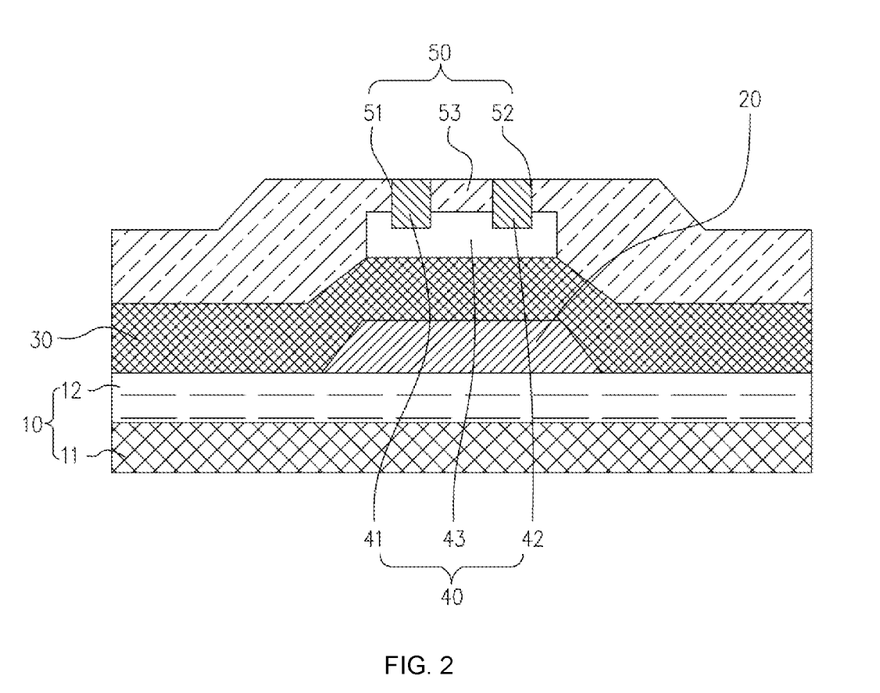
FIG. 2 illustrates a schematic structure of an array substrate of another embodiment of the present invention.

Further, another embodiment is provided. As shown in FIG. 2, the source transfer portion 41 extends through the first through hole 51 and the drain transfer portion 42 extends through the second through hole 52. Specifically, the source transfer portion 41 and the drain transfer portion 42 are formed by means of a deposition process, and the source transfer portion 41 is electrically connected to the source electrode 210 through the first through hole 51 and the drain transfer portion 42 is electrically connected to the drain electrode 220 through the second through hole 52. Thus, for a liquid crystal display panel 200 that involves the array substrate 100, the structures of the source electrode 210 and drain electrode 220 are made simple and easy to form so that application of the array substrate 100 can be improved.

Referring to FIG. 3, the present invention also provides a liquid crystal display panel 200. The liquid crystal display panel 200 includes the array substrate 100, a liquid crystal layer 230 and a color filter substrate 240. The liquid crystal layer 230 is stacked on the source electrode 210 and the drain electrode 220. The color filter substrate 240 is stacked on the liquid crystal layer 230. Specifically, a portion of the source electrode 210 extends through the first through hole 51 to contact the source transfer portion 41 and electrically connect to the source transfer portion 41. A portion of the drain electrode 220 extends through the second through hole 52 to contact the drain transfer portion 42 and electrically connect to the drain transfer portion 42.

It can be understood that the present invention is also applicable to a flexible display panel, and an organic light emitting layer structure and an encapsulation layer structure can be successively formed on the array substrate. The organic light emitting layer structure and the encapsulation layer structure are commonly known structures of organic light emitting displays, and will not be further described herein.

Figure 4:
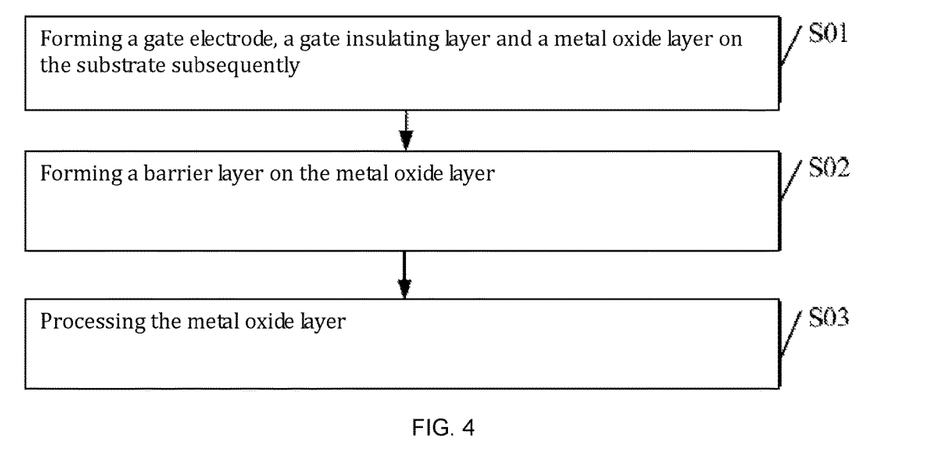
FIG. 4 illustrates a schematic flow of the steps of the method of manufacturing the array substrate of the present invention.
Figure 5:
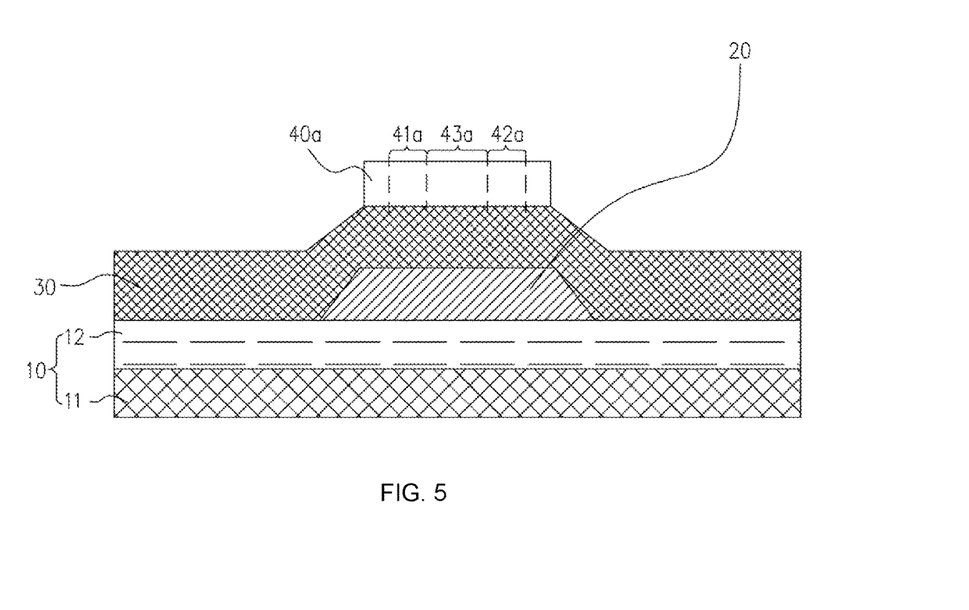
FIG. 5 illustrates a schematic structure of step S01 of the steps of the method of manufacturing the array substrate of the present invention.
Figure 6:
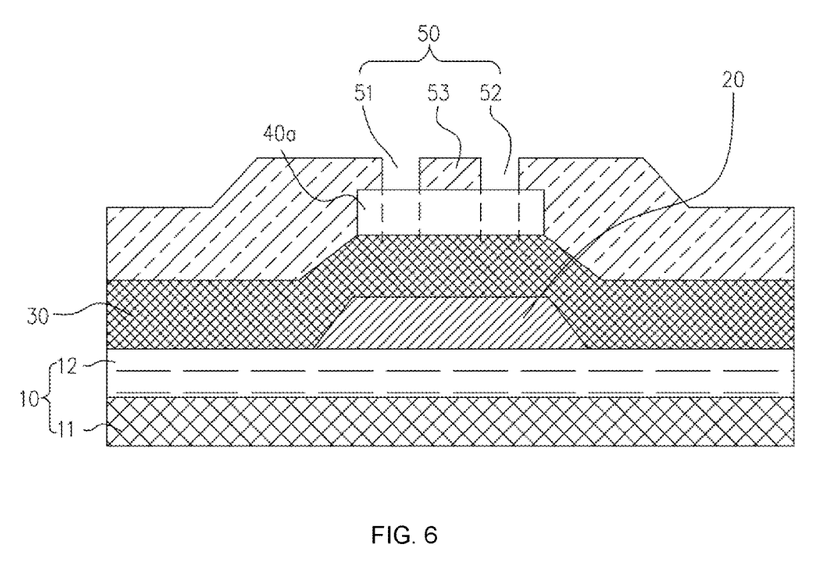
FIG. 6 illustrates a schematic structure of step S02 of the steps of the method of manufacturing the array substrate of the present invention.

Further, referring to FIGS. 4, 5, and 6, the present invention also provides a method for manufacturing an array substrate. The method is used to form the array substrate 100. The method includes the following steps:

S01: forming a gate electrode 20, a gate insulating layer 30, and a metal oxide layers 40a sequentially stacked on a substrate 10, wherein the metal oxide layer includes a first region 41a and a second region 42a isolated from the first region 41a, and a third region 43a connected to the first region 41a and the second region 42a.

In this embodiment, the metal oxide layer is indium gallium zinc oxide. The metal oxide layer may include a large number of oxygen vacancies, which results in poor conductive properties of the metal oxide. Therefore, high temperature annealing is needed for the metal oxide layer. The metal oxide layer is divided into three regions, including the first region 41a, the second region 42a, and the third region 43a. The first region 41a and the second region 42a are used to a source transfer portion 41 and a drain transfer portion 42, and the third region 43a is used to form a channel 43. As an embodiment, the metal oxide layer 40a can be formed with a vacuum evaporation process or a deposition process. Then, the metal oxide layer is etched through a patterning process. S02: forming a barrier layer 50 on the metal oxide layer, wherein the barrier layer 50 has a first through hole 51 and a second through hole 52 isolated from the first through hole 51, and a light shielding area 53 formed between the first through hole 51 and the second through hole 52. The first through hole 51 and the second through hole 52 expose the first region and the second region respectively, and the light shielding area 53 covers the third region. Step S02 may specifically includes the following steps:

Depositing a complete barrier layer to be processed on the metal oxide layer.

In this embodiment, the barrier layer to be processed is formed with a vapor deposition process within a predetermined region, and the barrier layer to be processed completely covers the metal oxide layer.

Portions of the barrier layer to be processed that correspond to the first region and the second region are etched respectively to form the first through hole 51 and the second through the hole 52.

After the first through hole 51 and the second through the hole 52 are formed through etching the barrier layer to be processed, an un-etched portion of the barrier layer to be processed that is connected to the first through hole 51 and the second through the hole 52 forms a light shielding area 53 is formed so that the barrier layer 50 is formed through the etching of the barrier layer to be processed. In other embodiments, the light shielding area 53 can be formed with vacuum deposition on a portion of the metal oxide layer 40a corresponding to the third region 43a, and portions corresponding to the first region 41a and the second region 42a receive no deposition thereon, so that after completion of the deposition of the barrier layer 50, the first through hole 51 and the second through hole 52 are formed in the non-deposition portions corresponding to the first region 41a and the second region 42a.

With the first through hole 51 and the second through hole 52 of the barrier layer 50 respectively exposing the first region 41a and the second region 42 and the light shielding area 53 covering the third region 43a, the source transfer portion 41, the drain transfer portion 42 and the channel 43 can be formed through differentiation of temperature realized with only one laser annealing irradiation process, thereby saving steps of a formation process, reducing production costs, and improving production efficiency.

S03: processing the metal oxide layer such that the first region 41a and the second region 42a are respectively formed into a source transfer portion 41 and a drain transfer portion 42 at a first predetermined temperature, and the third region 43a is formed into a channel 43 at a second predetermined temperature.

In this embodiment, the metal oxide layer is annealed through irradiation of laser light. Since the first through hole 51 and the second through hole 52 expose the first region 41a and the second regions 42a respectively, the first region 41a and the second region 42a are subjected to direct irradiation of laser light, so that portions of the metal oxide corresponding thereto are rapidly heated to the first predetermined temperature (above 500° C.), whereby at least parts of the metal oxide in the first regions 41a and the second regions 42a lose oxygen and form the source transfer portion 41 and the drain transfer portion 42, respectively. Since the light shielding area 53 is arranged to cover the third region 43a to prevent the laser from directly irradiating the third region 43a, so that the light shielding area 53 can absorb a part of heat of the laser and the heat is transferred to the third region 43a through the light shielding area 53 to make the temperature of the third region 43a of the metal oxide raise to a second predetermined temperature (about 250° C. to 400° C.). The light shielding area 53 helps prevent a processing temperature of the third region 43a from getting excessively high so that the third region 43a is separate from the first regions 41a and the second regions 42a to eventually form the channel 43. By using the light shielding area 53 of the barrier layer 50 to cover the third region 43a, simultaneously forming the source transfer portion 41, the drain transfer portion 42 and the channel 43 can be realized through annealing with only one laser irradiation process, thereby saving steps of the formation process, reducing production costs, and improving production efficiency. In other embodiments, it is possible to first irradiate the first regions 41a and the second regions 42a with laser light of a first predetermined temperature to form the source transfer portion 41 and the drain transfer portion 42, and laser light of a second predetermined temperature is then applied to irradiate the third regions 43a to form the channel 43.

The present invention provides an array substrate, a liquid crystal display panel, and a method for manufacturing an array substrate, wherein with an arrangement that an active layer includes a source transfer portion and a drain transfer portion isolated from the source transfer portion and a channel integrally connected to the source transfer portion and the drain transfer portion, the source transfer portion, the drain transfer portion and the channel are made as an integral structure, i.e., contact resistances between the source transfer portion, the drain transfer portion and the channel are reduced, so that with the source and drain electrodes, an on-state current of a thin film transistor of a liquid crystal display panel is increased and an off-state current is reduced through, and thus the on/off ratio is raised, to thereby improve the performance of the array substrate. In addition, in a laser irradiation process that is applied to form the source transfer portion and the drain transfer portion, the defects in the channel are significantly reduced by the annealing process, to improve the performance of thin film transistors.

The above provides preferred embodiments of the present invention, which are not intended to limit the scope of the present invention. Any modifications, equivalent replacements or improvements within the spirit and principles of the embodiment described above should be covered by the protected scope of the invention.

What is claimed is:

1. An comprising a substrate, a gate electrode, a gate insulating layer and an active layer formed in sequence in a stack, wherein the active layer comprises a source transfer portion and a drain transfer portion separated from the source transfer portion, and a channel integrally connected to the source transfer portion and the drain transfer portion; wherein the source transfer portion and the drain transfer portion are formed at a first predetermined temperature and the channel is formed at a second predetermined temperature, the first predetermined temperature being higher than the second predetermined temperature;

wherein the active layer, source transfer portion, and the drain transfer portion are simultaneously formed of a layer of a predetermined material, which is disposed on the gate insulating layer and comprises a first region and a second region respectively at two ends of the layer of the predetermined material and a third region located between and connected to the first and second regions, wherein surface parts of the first region and the second region that are adjacent to a surface of the layer of the predetermined material distant from the gate insulating layer are formed into the source transfer portion and the drain transfer portion at the first predetermined temperature, respectively, and the third region is formed, at the second predetermined temperature, into the channel that connects between the surface parts of the first and second regions that are formed into the source and drain transfer portions, wherein the surface parts of the first region and the second region that are formed into the source transfer portion and drain transfer portion are integral portions of the metal oxide layer and are integrally connected with the channel;

wherein a barrier layer is disposed on the surface of the layer of the predetermined material that is distant from the gate insulating layer and has a first through hole and a second through hole separate from the first through hole, and a light shielding area between the first through hole and the second through hole, wherein the first through hole and the second through hole expose the source transfer portion and the drain transfer portion respectively and the light shielding area covers the channel, such that laser irradiating on the barrier layer is allowed to pass directly through the first and second through holes to cause the first predetermined temperature in the source transfer portion and the drain transfer portion and the light shielding area absorbs and converts a part of the laser irradiating on the barrier into heat that is transferred to the channel to cause the second predetermined temperature in the channel.

2. The array substrate according to claim 1, further comprising a source electrode and a drain electrode disposed on the barrier layer, wherein the source electrode is connected to the source transfer portion through the first through hole, and the drain electrode is connected to the drain transfer portion through the second through hole.

3. The array substrate according to claim 1, wherein the substrate comprises a plastic layer and a buffer layer stacked on the plastic layer, the gate electrode being stacked on the buffer layer and opposite to the plastic layer.

4. The array substrate according to claim 1, wherein the predetermined material comprises an oxide semiconductor.

5. The array substrate according to claim 4, wherein the source transfer portion and the drain transfer portion that are located at the two ends of the active layer are formed through laser crystallization.

6. A liquid crystal display panel, comprising an array substrate that comprises a substrate, a gate electrode, a gate insulating layer and an active layer formed in sequence in a stack, wherein the active layer comprises a source transfer portion and a drain transfer portion separated from the source transfer portion, and a channel integrally connected to the source transfer portion and the drain transfer portion; wherein the source transfer portion and the drain transfer portion are formed at a first predetermined temperature and the channel is formed at a second predetermined temperature, the first predetermined temperature being higher than the second predetermined temperature;

wherein the active layer, source transfer portion, and the drain transfer portion are simultaneously formed of a layer of a predetermined material, which is disposed on the gate insulating layer and comprises a first region and a second region respectively at two ends of the layer of the predetermined material and a third region located between and connected to the first and second regions, wherein surface parts of the first region and the second region that are adjacent to a surface of the layer of the predetermined material distant from the gate insulating layer are formed into the source transfer portion and the drain transfer portion at the first predetermined temperature, respectively, and the third region is formed, at the second predetermined temperature, into the channel that connects between the surface parts of the first and second regions that are formed into the source and drain transfer portions, wherein the surface parts of the first region and the second region that are formed into the source transfer portion and drain transfer portion are integral portions of the metal oxide layer and are integrally connected with the channel;

wherein a barrier layer is disposed on the surface of the layer of the predetermined material that is distant from the gate insulating layer and has a first through hole and a second through hole separate from the first through hole, and a light shielding area between the first through hole and the second through hole, wherein the first through hole and the second through hole expose the source transfer portion and the drain transfer portion respectively and the light shielding area covers the channel, such that laser irradiating on the barrier layer is allowed to pass directly through the first and second through holes to cause the first predetermined temperature in the source transfer portion and the drain transfer portion and the light shielding area absorbs and converts a part of the laser irradiating on the barrier into heat that is transferred to the channel to cause the second predetermined temperature in the channel.

7. The liquid crystal display panel according to claim 6, wherein the array substrate further comprises a source electrode and a drain electrode disposed on the barrier layer, the source electrode being connected to the source transfer portion through the first through hole, the drain electrode being connected to the drain transfer portion through the second through hole.

8. The liquid crystal display panel according to claim 6, wherein the substrate comprises a plastic layer and a buffer layer stacked on the plastic layer, the gate electrode being stacked on the buffer layer and opposite to the plastic layer.

9. The liquid crystal display panel according to claim 6, wherein the predetermined material comprises an oxide semiconductor.

10. The liquid crystal display panel according to claim 9, wherein the source transfer portion and the drain transfer portion that are located at the two ends of the active layer are formed through laser crystallization.

* * * * *